United States Patent
Patrissi et al.

(10) Patent No.: US 11,460,505 B1
(45) Date of Patent: Oct. 4, 2022

(54) IMPLANTABLE THERMAL RUNAWAY TRIGGER DEVICE

(71) Applicant: The United States of America as represented by the Secretary of the Navy, Newport, RI (US)

(72) Inventors: Charles J Patrissi, Newport, RI (US); Jason L Mercier, Middletown, RI (US)

(73) Assignee: The United States of America as represented by the Secretary of the Navy

( * ) Notice: Subject to any disclaimer, the term of this patent is extended or adjusted under 35 U.S.C. 154(b) by 340 days.

(21) Appl. No.: 16/841,718

(22) Filed: Apr. 7, 2020

(51) Int. Cl.
    *G01R 31/36* (2020.01)
    *H01M 10/48* (2006.01)
    *G01R 31/382* (2019.01)

(52) U.S. Cl.
    CPC ....... *G01R 31/3644* (2013.01); *G01R 31/382* (2019.01); *H01M 10/486* (2013.01)

(58) Field of Classification Search
    CPC ............. G01R 31/3644; G01R 31/382; H01M 10/486; H01M 4/62; H01M 50/342; Y02P 70/50

USPC .............................. 324/90, 425–434; 429/90
See application file for complete search history.

(56) References Cited

U.S. PATENT DOCUMENTS

| 2011/0172940 A1* | 7/2011 | Wood | G01R 31/3835 702/63 |
| 2013/0004811 A1* | 1/2013 | Banerjee | G01K 7/16 374/185 |

* cited by examiner

*Primary Examiner* — Patrick Assouad
*Assistant Examiner* — Trung Q Nguyen
(74) *Attorney, Agent, or Firm* — James M. Kasischke; Michael P. Stanley

(57) ABSTRACT

A modified battery cell for simulating failure conditions includes an electrical cell and a controllable voltage source. A transistor gate is joined to a positive output of the source and to a negative tab of the cell at the transistor source. One side of a resistor implanted in the cell is joined to the transistor drain and the other side is joined to the cell positive tab. Controlling voltage source voltage allows current to flow from the transistor source to the transistor drain and through the resistor. Current flow through the resistor causes heating within the electrical cell that can be monitored to simulate an electrical cell failure. A method for testing an electrical cell is also provided.

16 Claims, 3 Drawing Sheets

IMPLANTABLE THERMAL RUNAWAY TRIGGER DEVICE

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

(1) Field of the Invention

The present invention is directed to a modified electrochemical cell for testing a battery and more particularly to a cell for testing thermal runaway propagation through Li-ion batteries and mitigation strategies for thermal runaway in lithium ion cells.

(2) Description of the Prior Art

A practical and repeatable method for initiating thermal runaway in Li-ion battery cells is a critical step for proving that improved battery designs are more resistant to thermal runaway propagation and for testing methods being developed to quench thermal runaway. Li-ion battery cells contain high energy electrode materials (i.e., fuel and oxidizer) as well as combustible solvents, salts, and polymers that are stable at normal working temperatures. However, high temperatures can initiate any of several decomposition reactions in the cell creating heat. If the heat cannot be removed fast enough, the thermal feedback can exponentially increase the rate of the reactions causing the chemical energy of the battery to be rapidly, almost instantaneously, released as heat. This "thermal runaway" event can result in the evolution of toxic smoke, fire, and possibly explosion of the battery cell.

There are a number of methods being used to drive lithium ion cells into thermal runaway. National Renewable Energy Lab (NREL) and National Aeronautics and Space Administration (NASA) have partnered to develop an implantable internal short circuit. In their method copper and aluminum disks are placed between the anode and cathode in a lithium ion battery cell. The disks are electrically isolated from each other by a thin layer of wax. Heat is applied to liquefy the wax which wicks into the porous separator. Subsequently, the bare copper and aluminum disks provide a direct electrical connection between the anode and cathode, i.e. an internal short circuit. The resulting high current and power can create a local hot spot that can start the decomposition reactions and cascade into thermal runaway causing the cell to vent hot gases and burst into flames.

The drawbacks of this method are that this internal short circuit is limited to the low resistance path of the copper and aluminum disks and the requirement for externally applied heat to initiate the short circuit. Heat application required to activate the implantable short circuit complicates interpretation of the results because it raises the temperature of the trigger cell and surrounding cells, making them more prone to thermal runaway and propagation. Another complication is that this type of implantable short circuit doesn't accurately simulate the way short circuits form in lithium ion batteries. Short circuits are latent defects that change resistance over a number of charge and discharge cycles. Thus the severity, or resistance, of the short circuit cannot be investigated using this technique. Also, this method doesn't allow resistance control in an effort to develop detection methods for nascent short circuits. Finally, the effect of low temperature on the severity of thermal runaway cannot be investigated using this method because the trigger cell must be heated.

In operational circumstances, one of the paths to an internal short circuit is believed to start with small metal particles that are left over from the manufacturing process. They can dissolve at the cathode due to high voltage. The resulting metal ions subsequently plate at the anode and the deposit grows back to the cathode causing an internal short circuit. The short may be a "hard" short with low resistance that supports high current and develops into thermal runaway or it may be a "soft" short with high resistance and low current that is manifested by lower than normal cell voltage. Through $i^2R$ heating, high current shorts can create enough localized Joule heat to initiate heat releasing chemical reactions within the Li-ion cell.

Implanting metal particles in the cell under test has been used to simulate this operational failure as disclosed in a presentation by CAMX Power at the Third Battery Safety Council Forum on 13 Jan. 2017. The cell is disassembled by unwinding the rolled electrode, electrolyte structure or "jelly roll" of the cell. Metal particles are implanted by placing a metal particle in contact with the cathode or cathode current collector, rewinding the jelly roll, and sealing the jelly roll back into the can. Results from this testing show that a short circuit forms over a number of charge discharge cycles.

The metal particle implantation method provides a latent defect that develops into short circuit of varying severity. This is considered to more accurately represent a real world short circuit than the NREL/NASA method. This method does not allow precise timing control of the thermal runaway event because there is a time lag between the application of heat and the melting of the wax which initiates thermal runaway. Further, there are safety and reliability concerns regarding handling and transporting cells that will go into thermal runaway at 60° C. Also, the effect of cold and hot temperatures on thermal runaway cannot be investigated or simulated because of the melting temperature of the wax layer.

Another type of thermally activated implantable short circuit has been developed by Tsinghua University and the University of Michigan. A shape memory alloy is deformed while in a low temperature crystal phase allowing memory of the original shape when heated. The device is flat at low temperature when placed against the carbon anode in a lithium ion jelly roll. At increased temperature, the device flexes, piercing the separator and making contact with the cathode, causing an internal short circuit. The results using this method are reported to be reliable and repeatable and cause the cell to go into thermal runaway at high states of charge. As with the NREL/NASA method, heat is required to drive the shape change. Because it requires the application of external heat, this method has the same pitfalls as the NREL/NASA method. The precise time to thermal runaway is unknown, low and high temperatures cannot be investigated, and there are safety and reliability concerns. As with the NREL/NASA method, this method doesn't allow control of the implantable short circuit resistance.

FIG. 1 shows a cross section of the electrode structure inside a lithium ion battery cell 10. It has become common to use the word "battery" to refer to a single galvanic cell with one pair of negative and positive electrodes; however, the term battery more typically refers to multiple cells in a series and/or parallel arrangement. The electrode structure in a single Li-ion battery cell, e.g. an "18650" cell, is usually made as a sheet. This sheet is sufficiently flexible to be wound into a cylindrical "jelly roll." Other shapes such as pouch and prismatic cells are also possible. Assembly is complete once the cell is filled with liquid electrolyte. Cell 10 includes a positive collector 12 and a negative collector 14. In a common lithium-ion cell, positive collector 12 is made from aluminum. Negative collector 14 is made from copper. Positive collector 12 is in contact with a positive active layer 16, and negative collector 14 is in contact with a negative active layer 18. A separator 20 is positioned between positive active layer 16 and negative active layer 18. Separator 20 is typically porous and filled with an electrolyte. A positive terminal or tab 22 is joined to positive collector 12, and a negative terminal or tab 24 is joined to negative collector 14.

Four types of internal short circuits can be created by bridging the anode and cathode layers of cell 10 as shown in FIG. 1. Type I is positive active layer 16 to negative active layer 18. Type II is positive collector 12 to negative active layer 18. In a type III internal short circuit, negative collector 14 is bridged to positive active layer 16. In type IV, positive collector 12 is connected to negative collector 14.

Prior art research has determined that there are three factors that affect the severity of thermal runaway. They are the resistance of the short circuit, type of the short circuit, and the temperature of the trigger cell. The methods developed to date have succeeded with controlling the type of the short circuit but not its resistance. In addition, they also require the trigger cell to be heated which increases thermal runaway severity and probability. There are also safety and reliability concerns because of the need to control cell temperature during storage and handling. Tests to date utilizing highly conductive short circuits have shown that the type II internal short circuit (between positive current collector and negative active layer) results in significant heat generation and thermal runaway while the other types of internal short circuits will affect cell performance but don't always lead to thermal runaway.

Accordingly, there is a need for a thermal runaway trigger method that is powered by the cell's own stored chemical energy and allows variable heating in a cell location. It is further needed that such method be safe and reliable for transportation and handling. It is also beneficial that such method be capable of triggering thermal runaway instantaneously based on a user input signal.

SUMMARY OF THE INVENTION

It is a first object of the present invention to provide a modified battery cell capable of triggering thermal runaway using the cell's own stored chemical energy.

Another object is to provide an a battery cell with variable heating levels.

Accordingly, there is provided a modified battery cell for simulating failure conditions in an electrical cell. This includes an electrical cell and a controllable voltage source. A transistor gate is joined to a positive output of the controllable voltage source and to a negative tab of the cell at the transistor source. One side of a resistor implanted in the cell is joined to the transistor drain and the other side is joined to the cell positive tab. Controlling voltage source voltage allows current to flow from the transistor source to the transistor drain and through the resistor. Current flow through the resistor causes heating within the electrical cell that can be monitored to create a Li-ion battery cell thermal runaway failure. A method for testing an electrical cell is also provided.

BRIEF DESCRIPTION OF THE DRAWINGS

Reference is made to the accompanying drawings in which are shown an illustrative embodiment of the invention, wherein corresponding reference characters indicate corresponding parts, and wherein.

DETAILED DESCRIPTION OF THE INVENTION

Figure 2:
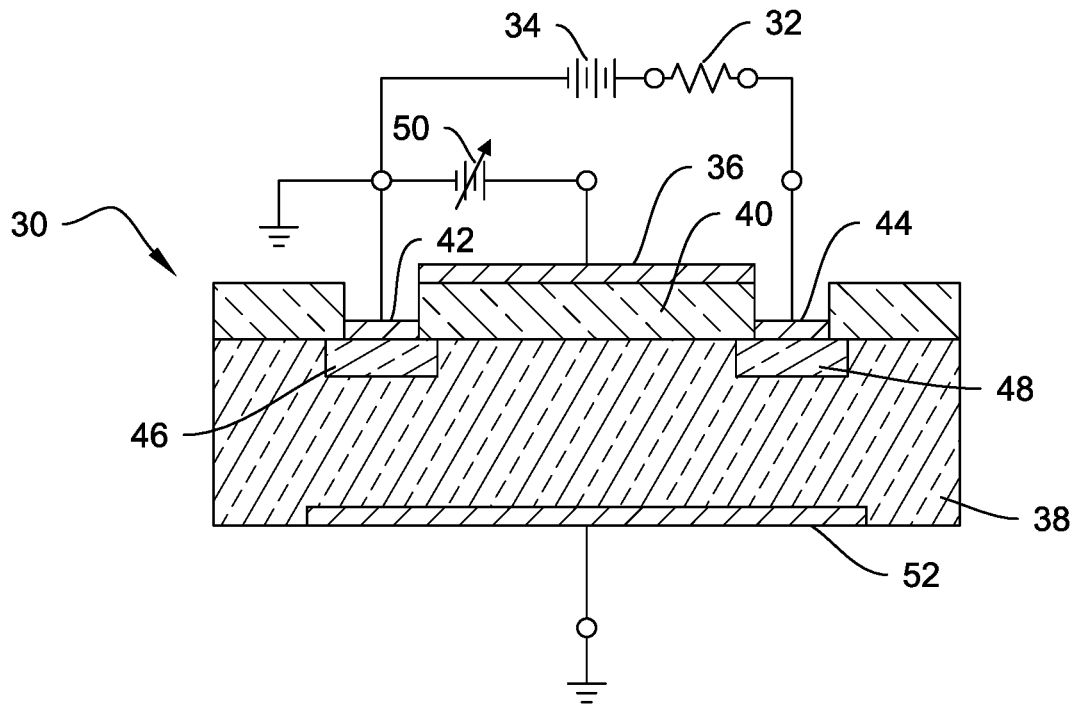
FIG. 2 is a cross-sectional view of an N-channel metal oxide semiconductor field effect transistor MOSFET.

An embodiment of the method herein utilizes an electronic switch to control a resistor implanted inside the electrode structure of a lithium ion battery cell in order to test these cells. Use of this technique allows current from the cell under test to initiate internal heating, creating a safer, temperature independent thermal runaway trigger method than in the prior art. A metal oxide semiconductor field effect transistor (MOSFET) is preferred as the electronic switch. FIG. 2 shows the critical elements of an N-Channel MOSFET 30 with a resistor 32 as implemented in an embodiment of this device for testing an electrochemical cell 34. MOSFET 30 has a gate electrode 36, separated from the body 38 by a dielectric 40. The source 42 and drain 44 electrodes are connected to N+ regions, 46 and 48 respectively, within the p-doped body 38. Electron current from battery under test 34 flows between the source electrode 42 and drain electrode 44 while the resistance between them is controlled by a controllable voltage source 50 applied to gate electrode 36 and source electrode 42. Source 46 and drain 48 are N+ regions joined to source electrode 42 and drain electrode 44. These N+ regions have an excess of negative charge carriers (electrons). The p-type silicon used as the base 38 of the MOSFET has a deficit of electrons. A base electrode 52 may be included. Base electrode 52 is joined to the same ground as source electrode 42.

Gate electrode 36 voltage affects resistance in the channel between source 46 and drain 48. At zero applied gate voltage, the channel between the N+ regions is highly resistive (electron depleted) so no current can flow between the source electrode 42 and drain electrode 44. As voltage source 50 is made more positive, negative charges in the p-type body region 38 are attracted to the channel where they are trapped by the silicon dioxide dielectric. P-type body region 38 can have a base electrode 52 for biasing. The magnitude of the gate voltage provided by voltage source 50 controls the concentration of charge carriers in the channel and, so, the resistance through the channel. MOSFET resistance in the "fully on" state can be as low as a few milliohms.

Fully on gate voltage from source 46 results in maximum current traveling through p-type region between source 46 and drain 48. This also increases current from drain 44 to positive terminal of cell 34 through resistor 32. Heating is governed by the equation $P=I^2R$ where P is power in watts, I is current in amperes, and R is resistance in ohms.

Maximum heating will occur in the portion of the circuit having the highest resistance which will be at resistor 32. Resistor 32 can be implanted in cell 34 in a place where a simulated short is desired. Maximum $I^2R$ heating will occur when implanted short circuit resistance matches cell resistance. Current between source 46 and drain 48 increases linearly when resistance is decreased.

This will result in intense localized heating in resistor 32 and area around resistor 32. It is expected to drive a lithium ion cell into thermal runaway, i.e., rapid cell internal heating, cell disassembly, and rapid venting of cell components. Battery pack design and fire detection and fighting procedures can then be studied to mitigate the risk of a single or multiple thermal runaway events from propagating through an entire battery pack or to slow the propagation to allow mitigation measures time to be effective. The controllable variable heating of resistor 32 could also be used to investigate the effect of lesser heating on the probability of thermal runaway. This could be done by controlling the current through the resistor via an advanced electronic circuit or by changing the resistance of the resistor.

Figure 1:
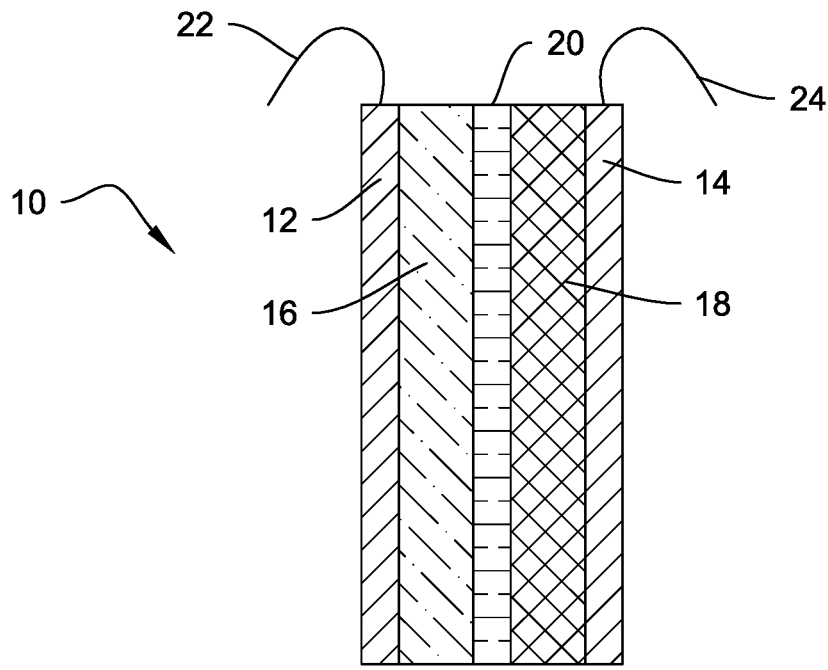
FIG. 1 is a cross-sectional view of a prior art Li-ion cell.
Figure 3:
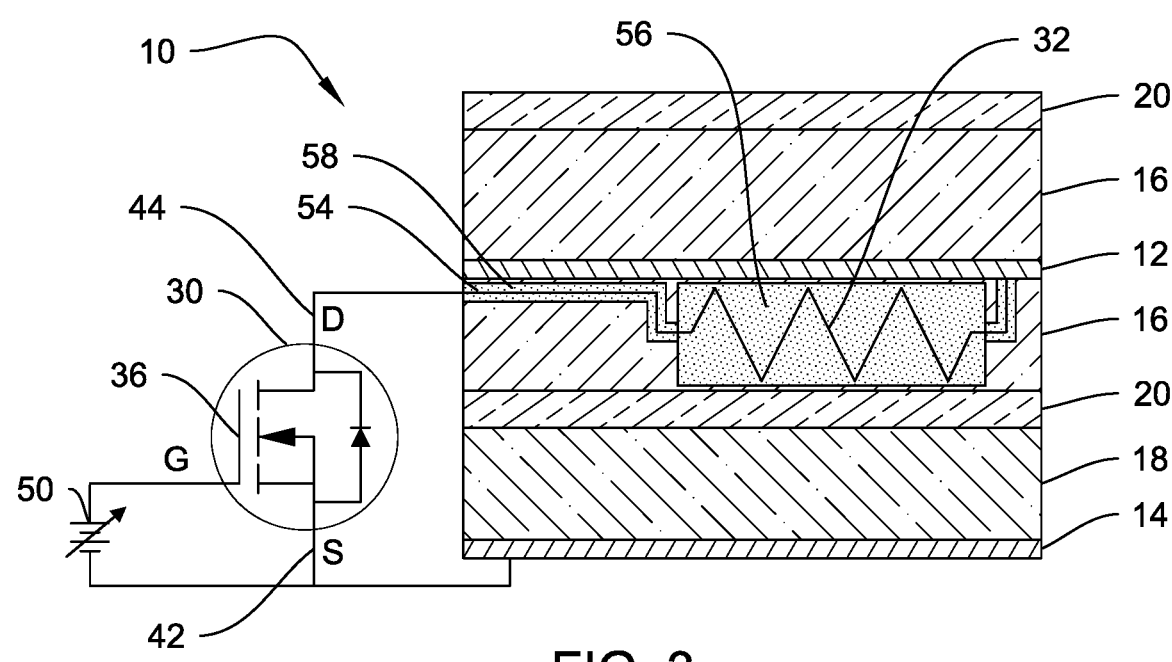
FIG. 3 is a cross-sectional view showing wiring of a MOSFET and resistor in a cell according to an embodiment.

FIG. 3 shows a more practical embodiment where resistor 32 is implanted in cell 10. Cell 10 is a multilayered cell 10 having component like those shown in FIG. 1. Cell 10 has a positive collector 12 in contact with a positive active layer 16, and a negative collector 14 in contact with a negative active layer 18. Positive collector 12 is typically aluminum, and negative collector 14 is typically copper. A porous separator 20 is provided between adjoining positive active layer 16 and negative active layer 18. A liquid electrolyte permeates the entire volume between positive collector 12 and negative collector 14. This allows transport of ions in the active layers 16 and 18. In this embodiment, resistor 32 is implanted in positive active layer 16. Resistor 32 is joined between transistor 32 drain electrode 44 and positive active layer 16 using wire 54. Resistor 32 is surrounded by electrically insulating material 56 in order to insulate electrical components of resistor 32 from positive active layer 16 and positive collector 12. Likewise, wire 54 is surrounded by insulating material 58 preventing electrical contact between cell 10 components and wire 54.

Resistor 32 is preferably made from a section of flat nichrome wire having a reduced diameter. The diameter and length of the wire can be determined to give the desired resistance level. Flat wire is preferred because it can fit in the a space hollowed out from the existing positive active layer 16. Nichrome is advantageous in this embodiment because of its heat and chemical resistance; however, other conductive materials could be used. Using a small diameter wire for a resistor also simplifies the mechanical challenges of implanting the heating device in a cell. Resistor 32 should have a sufficiently small diameter to fit between two layers of cell 10.

Insulation 56 should be resistant to solvents used in the battery electrolyte and should have a high heat resistance. Two such materials are polyimide and polytetrafluoroethylene, or the like. Other materials could be used. Resistor 32 with insulation 56 is substantially the same thickness as positive active layer 16. This allows a portion of positive active layer 16 to be removed to allow insulated resistor 32 to be positioned in layer 16 between separator 20 and positive collector 12.

Insulated wire 54 can be provided in active layer 16 proximate to positive collector 12 to connect a first end of resistor 32 to transistor 30 drain electrode 44. A second end of resistor 32 can be directly connected to positive collector (not shown) or insulated wire 54 can be used (shown in FIG. 3). In another embodiment, insulated wire can be provided to electrically connect second end of resistor 32 to an overall positive cell terminal.

An example of a transistor that could be used to control heating at resistor 32 is a MOSFET from Vishay Intertechnology (Part number SQSA80ENW). There are a number commercially available MOSFETs that have characteristics that allow use for controlling a heating resistor.

Other types of transistors other than MOSFETs could be used. The two main types of transistors are field effect transistors (FETs) and bipolar junction transistors (BJTs). FETs are easier to control as a standalone package. BJTs require very precise power sources to control alone and will otherwise require an extra resistor at the emitter to provide similar controllability to a FET.

In more detail, FETs are controlled via voltage input at the gate with little to no current draw. The preferred FETs utilized herein have a low short circuit current sensitivity to input voltage. At the very most, an input voltage of a volt or two will result in around 30 amps. Lower sensitivity is better since it is desirable to control the current as precisely as possible.

BJTs operate on input current into the gate. The amount of input current into the gate is multiplied by roughly 300 times down the short. A short circuit current of 30 A in a BJT translates to an input current of 0.1 A; however, controlling 0.1 A in BJT is difficult. The resistance of the input base is 300 times the resistance at the emitter. The resistance of the BJT emitter will be close to zero since it is essentially shorted straight to ground. This means that after 300 times, the resistance at the input base of the BJT will still be close to 0. This will make it nearly impossible to control for 0.1 A into the base of the BJT. This type of control requires a precise power supply or a resistor at the BJT emitter. However, if controllability isn't required, utilizing a BJT may offer greater short circuit current than a FET.

Figure 4:
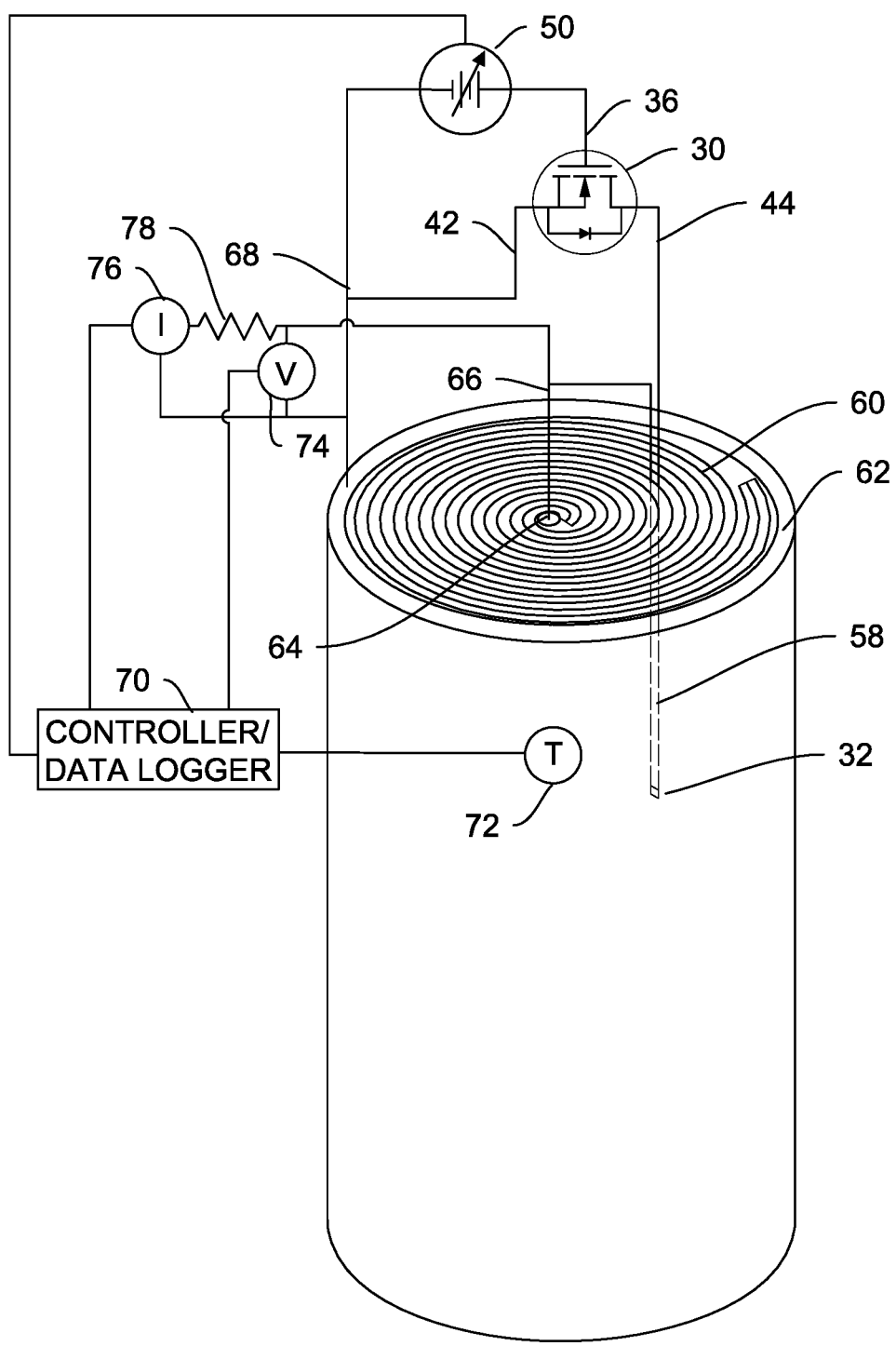
FIG. 4 shows an overview of a transistor and resistor positioned in a cell for testing.

FIG. 4 shows the layer structure of cell 10 rolled into a jelly roll 60 and positioned in a can 62. Cell 10 can have many more layers than shown in FIG. 3 or FIG. 4. An 18650 cell is utilized as a model for this embodiment. The top is removed to show the inside of the cell. A middle rod 64 serves as the positive tap for the positive collectors, and can 62 serves as the negative tap for the negative collectors. A positive wire 66 can be joined to rod 64, and a negative wire 68 can be joined to can 62. After positioning the jelly roll 60 in the can 62 electrolyte can be added. (In use, can 62 will be sealed.)

Transistor 30 can be positioned inside the top of can 62 or outside of can 62. Transistor gate electrode 36 is joined to the positive side of controllable voltage source 50 as described previously. Transistor source electrode 42 is joined to negative wire 68 which is also joined to the negative side of controllable voltage source 50. Transistor drain electrode 44 extends from transistor 30 and is joined to insulated wire 58 at the top of jelly roll 60. Insulated wire 58 extends into jelly roll 60, preferably along positive collector 12. Resistor 32 is electrically connected to wire 58 at a first end and positioned in jelly roll 60 at a desired test location. A second end of resistor 32 can be joined directly to positive collector 12 or, as in the embodiment shown, connected to positive wire 66. Connection to positive wire 66 should be by an insulated conductor.

Before testing and during filling of the cell with electrolyte, the gate electrode 36 should be connected to same potential as the source electrode 42 until it is desired to trigger thermal runaway. This insures that transistor 30 maintains a high resistance between its source and drain. To initiate testing, gate 36 voltage is increased to lower the resistance between transistor 30 source 42 and drain 44. Current will then flow from negative wire 68 through source electrode 42 to drain electrode 44 and along wire 58. Increased resistance at resistor 32 causes $I^2R$ heating, as described above. Current then enters positive collector 12 in one embodiment (FIG. 3) or travels along positive wire 66 to positive tap (FIG. 4) in another embodiment. Heating at resistor 32 simulates thermal runaway at the location of resistor 32.

FIG. 4 also shows test and control equipment that can trigger thermal runaway and provide data concerning its effects. A controller/data logger 70 is provided to monitor various sensors provided around the cell. These sensors can include a temperature sensor 72 that can be positioned inside or outside of can 62. Various electrical monitoring sensors such as a voltmeter 74 and an ammeter 76 coupled with a load resistor 78 can also be provided to monitor cell voltages and currents. Controller/data logger 70 can automatically record these sensor readings in a known recording medium. Controller/data logger 70 can also be joined to variable voltage source 50 in order to adjust gate 36 voltage and coordinate timing of events. Controller/data logger 70 can thus provide a signal allowing current flow through resistor 32 in order to provide selected test conditions.

Temperature, voltage, and current observations along with gas measurements are used to determine the condition of the cell under test. These may be coupled with visible indications of thermal runaway propagation. Observations that indicate thermal runaway propagation are smoke, fire, or high cell temperature. Once testing is the cell can be examined to determine where venting occurred (e.g., side wall, top, or bottom). If thermal runaway does not propagate through the cell provisions should be made for discharging the cell to zero state of charge before approaching for disassembly.

The transistor/resistor concept shown herein gives an embedded short circuit simulation with user selectable heating for triggering thermal runaway in battery cells. This is particularly useful for Li-ion battery cells. This technique does not require the application of external heat. The approach is temperature independent so that applied heat does not complicate interpretation of the test results. Further, the internal short circuit can be triggered over the entire operating temperature range of the cell to determine the effect of temperature on the severity of thermal runaway. Controllable heating is important for simulating a real world internal short circuit, unlike prior art methods where the state of the short circuit is unknown or binary.

Voltage control of MOSFET resistance allows the internal short circuit severity to be controlled by the user. Other control systems would also be useful for triggering thermal runaway. For example, it might be preferable to initiate thermal runaway after a certain number of charge discharge cycles or at a specific temperature. Controller/data logger 70 can provide this type of automated testing. This could include a charge discharge counter or temperature sensor to switch the MOSFET on after the preset conditions are met. The sensor circuitry can be inside or outside of the cell.

It will be understood that many additional changes in the details, materials, steps and arrangement of parts, which have been herein described and illustrated in order to explain the nature of the invention, may be made by those skilled in the art within the principle and scope of the invention as expressed in the appended claims.

The foregoing description of the preferred embodiments of the invention has been presented for purposes of illustration and description only. It is not intended to be exhaustive, nor to limit the invention to the precise form disclosed; and obviously, many modification and variations are possible in light of the above teaching. Such modifications and variations that may be apparent to a person skilled in the art are intended to be included within the scope of this invention as defined by the accompanying claims.

What is claimed is:

1. A modified battery cell for simulating failure conditions comprising:
    an electrical cell having a positive tab, and a negative tab;
    a controllable voltage source having a positive output and a negative output;
    a transistor having a source, a gate, and a drain, said transistor source electrically joined to said electrical cell negative tab and said controllable voltage source negative output, said transistor gate electrically joined to said controllable voltage source positive tab; and
    a heating resistor positioned in said electrical cell having a first end joined to said transistor drain and second end joined to said positive tab wherein voltage applied to said transistor gate controls current through said heating resistor to cause heating simulating a short circuit in said electrical cell.

2. The apparatus of claim 1, wherein said electrical cell is a multilayer electrical cell having a positive collector as a layer joined to said electrical cell positive tab, a negative collector as a layer joined to said electrical cell negative tab, a separator layer, a positive active material layer interposed between the separator layer and the positive collector, and a negative active material layer interposed between the separator layer and the negative collector.

3. The apparatus of claim 2, wherein said heating resistor is positioned in said electrical cell positive active material layer.

4. The apparatus of claim 3, wherein said heating resistor second end is joined electrically to said electrical cell positive collector within said electrical cell.

5. The apparatus of claim 2, further comprising:
    a can made from an electrically conductive material and joined to said electrical cell negative tab wherein said layers of said electrical cell are arranged in a spiral with the outermost portion of the spiral being said electrical cell negative collector and being in electrical contact with said can, the innermost portion of the spiral being said electrical cell positive collector; and
    a pole made from an electrically conductive material and positioned within said can at the center of said spirally arranged electrical cell and in electrical contact with said electrical cell positive collector.

6. The apparatus of claim 5, wherein said heating resistor is positioned in said electrical cell positive active material layer.

7. The apparatus of claim 6, wherein said heating resistor second end is joined electrically to said electrical cell positive collector within said electrical cell.

8. The apparatus of claim 1, wherein said heating resistor comprises a corrosion and heat resistant conductor and corrosion and heat resistant electrically insulating material surrounding the conductor.

9. The apparatus of claim 8, wherein said heating resistor is a flat wire having a reduced diameter with the diameter and length of the wire being chosen for a desired resistance value.

10. The apparatus of claim 1, further comprising:
    a temperature sensor positioned proximate to said electrical cell; and a data logger joined to said temperature sensor for recording changes in temperature at said temperature sensor over time.

11. The apparatus of claim 10, further comprising at least one electrical monitoring sensor joined to said electrical cell positive tab and said electrical cell negative tab, said electrical monitoring sensors being joined to said data logger for logging the electrical monitoring sensor output.

12. The apparatus of claim 11, wherein said data logger is joined to said controllable voltage source for providing a voltage control signal thereto.

13. A method for testing an electrical cell having a positive tab and a negative tab comprising the steps of:
providing a controllable voltage source having a positive output and a negative output;
providing a transistor having a source, a gate, and a drain;
joining the transistor source to the electrical cell negative tab and to the controllable voltage source negative output;
joining the transistor gate electrically joined to said controllable voltage source positive tab;
positioning a heating resistor in the electrical cell having a first end joined to said transistor drain and second end joined to said positive tab;
utilizing controllable voltage source to provide a positive charge to said transistor gate whereby said transistor allows current to flow from said transistor source to said transistor drain through said heating resistor to the electrical cell positive tab wherein said heating resistor causes heating simulating a short circuit in said electrical cell; and
monitoring parameters of the electrical cell while utilizing said controllable voltage source.

14. The method of claim 13, wherein said parameters comprise at least one parameter from the list of parameters including electrical cell temperature, electrical cell voltage, and electrical cell current output.

15. The method of claim 13, wherein:
said electrical cell is a multilayer electrical cell having a positive collector as a layer joined to said electrical cell positive tab, a negative collector as a layer joined to said electrical cell negative tab, a separator layer, a positive active material layer interposed between the separator layer and the positive collector, and a negative active material layer interposed between the separator layer and the negative collector; and
said step of positioning a heating resistor in the electrical cell comprises removing a portion of said positive active material layer and positioning said resistor in place of the removed portion.

16. The method of claim 15, further comprising the steps of:
providing a can made from an electrically conductive material;
providing a rod made from an electrically conductive material;
rolling said electrical cell into a cylinder after said step of positioning said heating resistor;
inserting said rolled electrical cell into said can such that said negative collector is in electrical contact with said can, said electrical cell negative tab being electrically connected to said can; and
inserting said rod into the center of said rolled electrical cell such that said positive collector is in electrical contact with said rod, said electrical cell positive tab being electrically connected to said rod.

* * * * *